United States Patent
Adkisson et al.

(10) Patent No.: US 7,586,139 B2
(45) Date of Patent: Sep. 8, 2009

(54) PHOTO-SENSOR AND PIXEL ARRAY WITH BACKSIDE ILLUMINATION AND METHOD OF FORMING THE PHOTO-SENSOR

(75) Inventors: James W. Adkisson, Jericho, VT (US);
Jeffrey P. Gambino, Westford, VT (US);
Mark D. Jaffe, Shelburne, VT (US);
Alan Loiseau, Williston, VT (US);
Richard J. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/276,218

(22) Filed: Feb. 17, 2006

(65) Prior Publication Data
US 2006/0102973 A1 May 18, 2006
US 2007/0194397 A1 Aug. 23, 2007

(51) Int. Cl.
*H01L 31/062* (2006.01)
*H01L 21/00* (2006.01)

(52) U.S. Cl. ............ 257/292; 257/290; 257/291; 257/447; 257/460; 257/E31.055; 438/48

(58) Field of Classification Search ........... 257/447, 257/460, 440, 431, 432, 228, 225, 290–292, 257/294, E31.055, E31.097
See application file for complete search history.

(56) References Cited

U.S. PATENT DOCUMENTS

| | | | |
|---|---|---|---|
| 5,162,521 A | 11/1992 | Farina et al. | |
| 5,227,313 A | 7/1993 | Gluck et al. | |
| 5,270,221 A | 12/1993 | Garcia et al. | |
| 6,026,964 A * | 2/2000 | Hook et al. | 257/292 |
| 6,168,965 B1 | 1/2001 | Malinovich et al. | |
| 6,169,319 B1 * | 1/2001 | Malinovich et al. | 257/447 |
| 6,204,506 B1 | 3/2001 | Akahori et al. | |
| 6,429,036 B1 | 8/2002 | Nixon et al. | |
| 6,737,292 B2 | 5/2004 | Seo | |
| 7,166,828 B2 * | 1/2007 | Yamaguchi et al. | 250/208.1 |
| 2002/0084474 A1 | 7/2002 | Sarma et al. | |
| 2003/0025160 A1 * | 2/2003 | Suzuki et al. | 257/347 |
| 2005/0139828 A1 * | 6/2005 | Maruyama et al. | 257/59 |
| 2005/0233493 A1 * | 10/2005 | Augusto | 438/51 |
| 2006/0145213 A1 * | 7/2006 | Ha | 257/292 |
| 2008/0017946 A1 * | 1/2008 | Cazaux et al. | 257/447 |
| 2008/0032438 A1 * | 2/2008 | Wen et al. | 438/60 |

* cited by examiner

*Primary Examiner*—Theresa T Doan
*Assistant Examiner*—Sarah K Salerno
(74) *Attorney, Agent, or Firm*—Law Office of Charles W. Peterson, Jr.; Anthony Canale (57) ABSTRACT

An imaging sensor with an array of FET pixels and method of forming the imaging sensor. Each pixel is a semiconductor island, e.g., N-type silicon on a Silicon on insulator (SOI) wafer. FETs are formed in one photodiode electrode, e.g., a P-well cathode. A color filter may be attached to an opposite surface of island. A protective layer (e.g., glass or quartz) or window is fixed to the pixel array at the color filters. The image sensor may be illuminated from the backside with cell wiring above the cell. So, an optical signal passes through the protective layer is filtered by the color filters and selectively sensed by a corresponding photo-sensor.

20 Claims, 6 Drawing Sheets

PHOTO-SENSOR AND PIXEL ARRAY WITH BACKSIDE ILLUMINATION AND METHOD OF FORMING THE PHOTO-SENSOR

BACKGROUND OF THE INVENTION

1. Field of the Invention

The present invention generally relates to pixel sensors and more particularly to CMOS image sensors.

2. Background Description

Digital cameras have largely replaced film based analog cameras, at least for amateur photography. A typical digital camera image sensor is an array of picture cells (pixels), each sensing a small fragment of the light for an entire image. Generally, the higher the number of pixels, the better the resulting images (pictures) and the larger an image may be viewed before becoming pixilated. Thus, the number of pixels is a primary measure of the image resolution, and directly affects the sharpness and crispness of the resulting images. Early digital cameras included bucket brigade sensors with Charge Coupled Devices (CCDs) for pixel sensors. Integration, power, and frame rate considerations have driven the industry to convert from CCDs to image sensors that are based on more standard CMOS logic semiconductor processes.

A typical CMOS image sensor array is, simply, an array of photodiodes with connected CMOS support and sensor circuits. Light striking each photodiode creates electron-hole pairs. The photodiode captures and stores the electrons. CMOS support circuits sense the charge stored in each diode. A color pixel sensing red, green or blue is just an appropriately filtered diode, with a red, green or blue filter to block all light outside of the particular bandwidth, i.e., red, green or blue. CMOS image sensors have allowed pixel density to increase well above 4 MegaPixels (4 MP), even as typical digital cameras have gotten more and more compact, e.g., some are even embedded in cell phones.

Unfortunately, as pixel areas have shrunk to improve density, fabricating dense CMOS image sensor arrays has become more challenging. CMOS has not been particularly suited to efficient pixel design because dense chip/array wiring formed above the array tends to block or diffuse light to the underlying pixels. CMOS device structures also overlay and tend to obstruct photo-sensor diodes (photodiode). So, polysilicon gates and array/chip wiring tend to reduce the amount of light energy reaching the photodiode. Also, the device structures and wiring limit the incident angle at which light can be collected. This is exacerbated by shrinking cell size, which is necessary for higher pixel density. Shrinking the cell requires even smaller photodiodes that are more densely packed in the pixel array.

Finally, filters in colored filtered arrays (CFA) are often physically displaced from the pixel imaging surface. This displacement causes light to diffract. Consequently, the image can smear due to light bleeding in from adjacent pixels.

Thus, there is a need for denser, simpler imaging sensors, that are easier to produce and more particularly, for denser, simpler, easier to produce CMOS pixel arrays.

SUMMARY OF THE INVENTION

It is therefore a purpose of the invention to maximize image sensor signal reception;

It is another purpose of this invention to minimize photodiode obstruction in CMOS pixels;

It is yet another purpose of the invention to maximize the signal received by photodiodes in CMOS pixel arrays;

It is yet another purpose of the invention to simplify CMOS pixel array construction with the each pixel exposed for maximum energy reception;

The present invention is related to an imaging sensor with an array of FET pixels and method of forming the imaging sensor. The image sensor may be built on a SOI substrate. Each pixel is a semiconductor island, e.g., N-type silicon. FETs are formed in one photodiode electrode, e.g., a P-well cathode. The image sensor may be illuminated from the backside with cell wiring is above the cell. A color filter may be attached to an opposite surface of island. A protective layer (e.g., glass or quartz) or window is fixed to the pixel array at the color filters. So, an optical signal passes through the protective layer is filtered by the color filters and selectively sensed by a corresponding photo-sensor.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
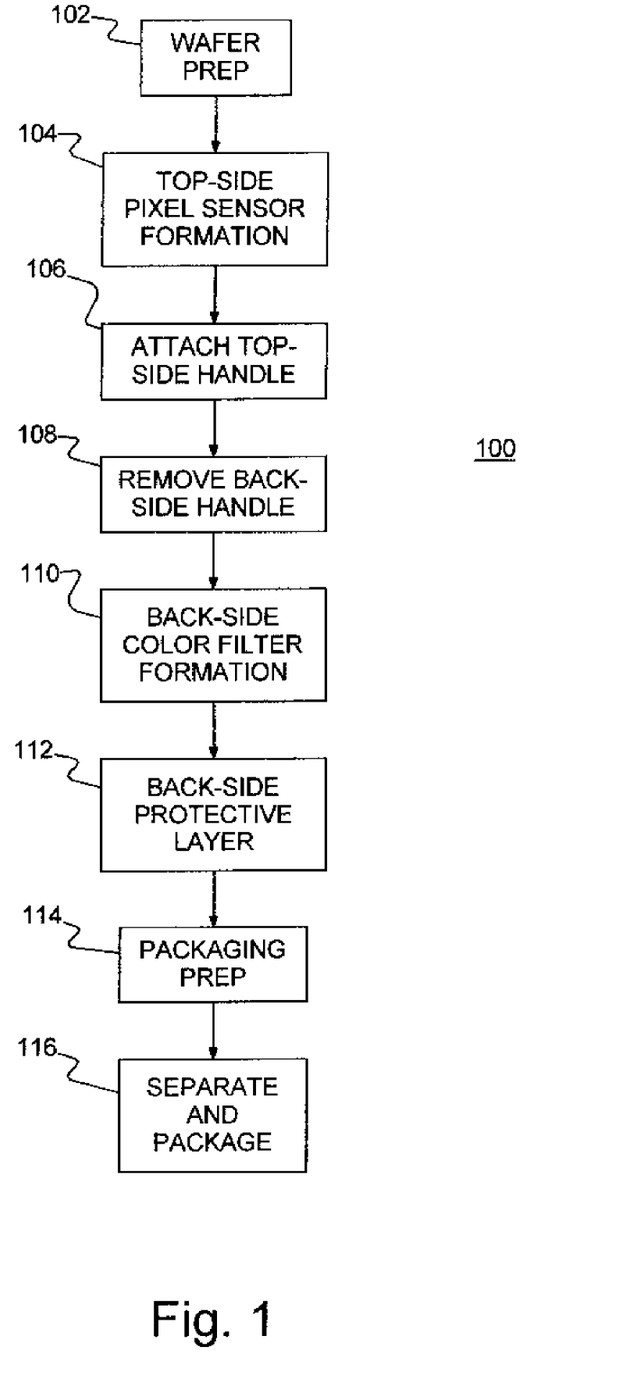
FIG. 1 shows an example of steps in forming a CMOS imaging sensor according to a preferred embodiment of the present invention.

Turning now to the drawings, and more particularly, FIG. 1 shows an example 100 of forming an imaging sensor according to a preferred embodiment of the present invention. Sensor formation begins in step 102 by preparing a semiconductor wafer, e.g., by forming a dielectric layer, such as thermal oxide, on the surface of a silicon wafer. A bonding layer (e.g., nitride) is formed on the dielectric layer and a first handle wafer is bonded to the bonding layer. In step 104 image pixel sensors are formed on the exposed side of the silicon wafer, preferably, coincident with normal circuit formation. Preferably, chip circuits are formed in the insulated gate Field Effect Transistor (FET) technology commonly known as CMOS. Further, although described herein with respect to CMOS, the present invention has application to forming pixel arrays in any FET technology.

Chip circuit formation proceeds through inter-circuit wiring and, preferably to off-chip connections, i.e., in what is commonly referred to as the Back End Of the Line (BEOL). In step 106, a second handle wafer is attached to the top side of the wafer, i.e., above the circuits and any BEOL wiring. Then, the first handle wafer is removed in step 108, e.g., grinding and/or etching to the nitride layer, and the exposed nitride layer is removed, e.g., etched away, to re-expose the thermal oxide layer. A layer of color filter is formed on the exposed thermal oxide layer in step 110, e.g., masking and depositing each of three colors filters, red, green and blue, on a pixel. In step 112, a protective layer is formed on the color filter layer. The protective layer both protects the color filter layer and also, preferably, acts as a packaging image window for the imaging sensor. Optionally, in step 114, package dependent processing is done to facilitate contact from the chip to the package. Package interconnect dependent processing for wire bonding or Controlled Collapsible Chip Connects (C4), for example, requires removing the top handle wafer for access to the bond pads. For other package types, e.g., packages available from the Shell Case Company, no additional processing is necessary and optional step 114 may be skipped. So in step 116, the wafer is diced into individual sensor chips and the chips are packaged, e.g., using flip ship or wire bond packaging.

FIGS. 2A-G, show a cross-sectional example through a wafer 120 at a preferred pixel array, showing the steps of forming a CMOS imaging sensor, e.g., according to the example 100 in FIG. 1. Formation begins in FIG. 2A with a suitable wafer 120 (step 102), preferably, a Silicon On Insulator (SOI) wafer. In particular, the wafer may be a silicon wafer with a buried oxide layer or, in this example, a bonded SOI wafer prepared, e.g., formed using bonding techniques from the SOITEC Corporation. A dielectric layer 122, such as thermal oxide, is formed on one surface of a semiconductor layer 124, e.g., a silicon layer or wafer. Preferably, the silicon layer 124 is 2-6 µm thick and the thermal oxide layer 122 is 0.1-1.0 µm thick. A 0.1-1.0 µm thick nitride layer 126 bonds the silicon layer 124 and dielectric layer 122 to a bottom handle wafer 128.

Figure 2A:
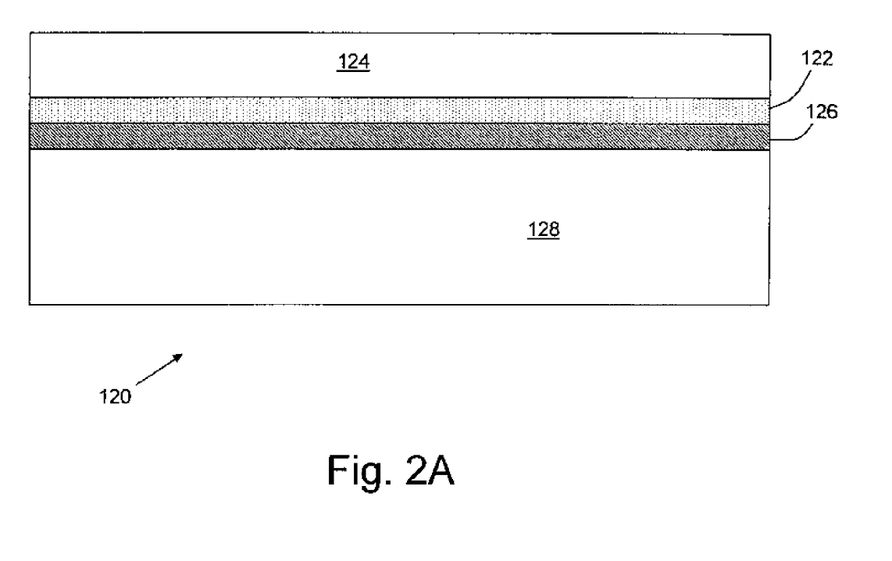
FIGS. 2A-G, show a cross-sectional example through a preferred pixel array showing the steps of forming a CMOS imaging sensor n.
Figure 2B:
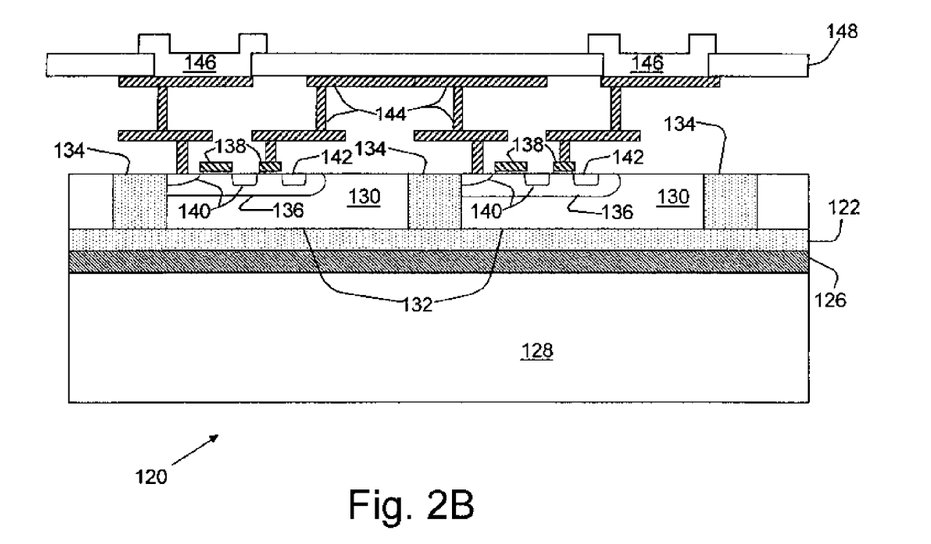

FIG. 2B shows image pixel sensors 130 formed in step 104 on the silicon layer 124. Although preferably, the image pixel sensors 130 are formed coincident with normal circuit formation; alternately the image pixel sensors 130 may be formed before or after or separate therefrom. So, islands 132 are defined in the silicon layer 124, e.g., using a typical shallow trench isolation technique to form and fill shallow trenches 134 between the islands 132. Isolation wells 136 (N-wells and/or P-wells) formed in the islands 132 form a photodiode with each island 130. Preferably, the islands are doped N-type and wells 136 are doped P-type. Devices are formed normally, e.g., forming a polysilicon layer on the surface and selectively defining polysilicon gates 138, followed by source/drain 140 definition. Diode contacts 142 are defined coincident with definition source/drains 140. Chip wiring 144 is formed through BEOL in dielectric layers for multiple alternating wiring and through via layers. Optionally, off-chip pads 146 for wire bonding or C4 interconnect may be formed in optional step 114, to facilitate contacting chip to package. Finally, an upper passivating layer 148 is formed on the wafer.

Figure 2C:
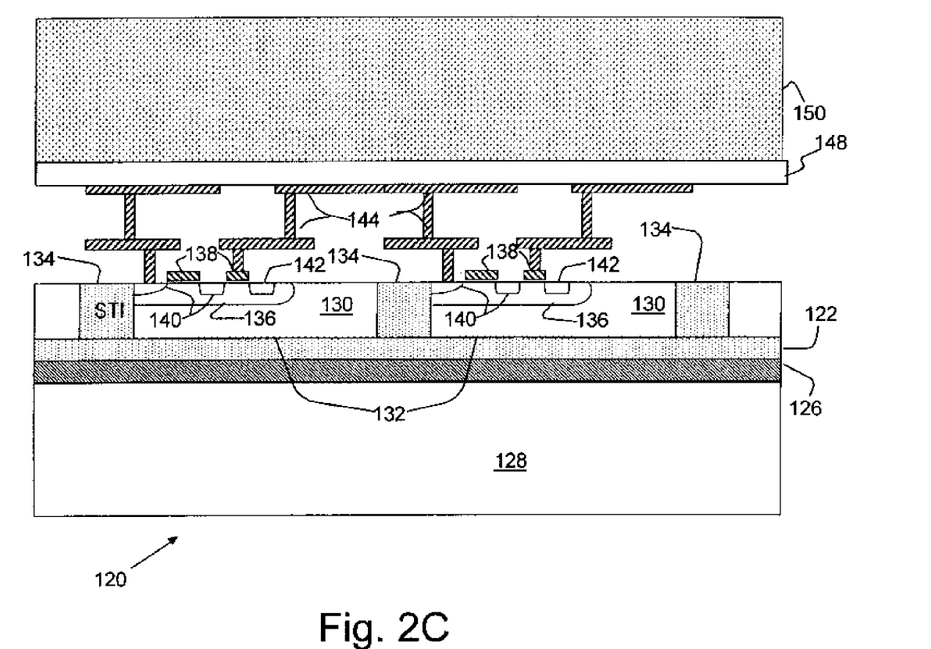
Figure 2D:
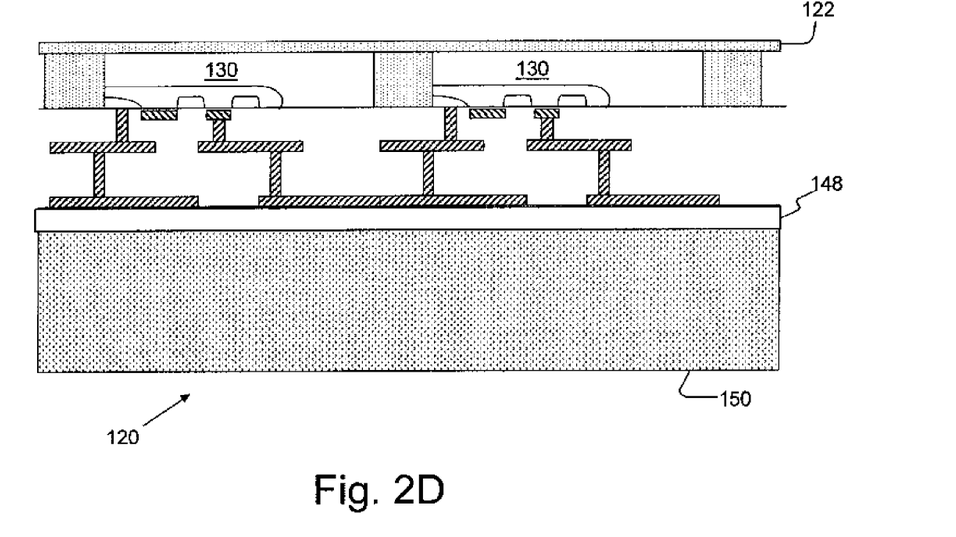

In FIG. 2C, a second or topside handle layer 150 is attached to the passivating layer 148 in step 106 of FIG. 1. The second handle layer 150 is attached above the image pixel devices (i.e., defined by polysilicon gates 138), and any BEOL wiring 144 or optional chip pads 146. Flipping the wafer 120 as shown in FIG. 2D, the bottom handle wafer is removed in step 108, e.g., grinding and/or etching to the nitride bonding layer 126. The exposed nitride bonding layer 126 is removed, e.g., etched away, to re-expose the thermal oxide layer 122.

Figure 2E:
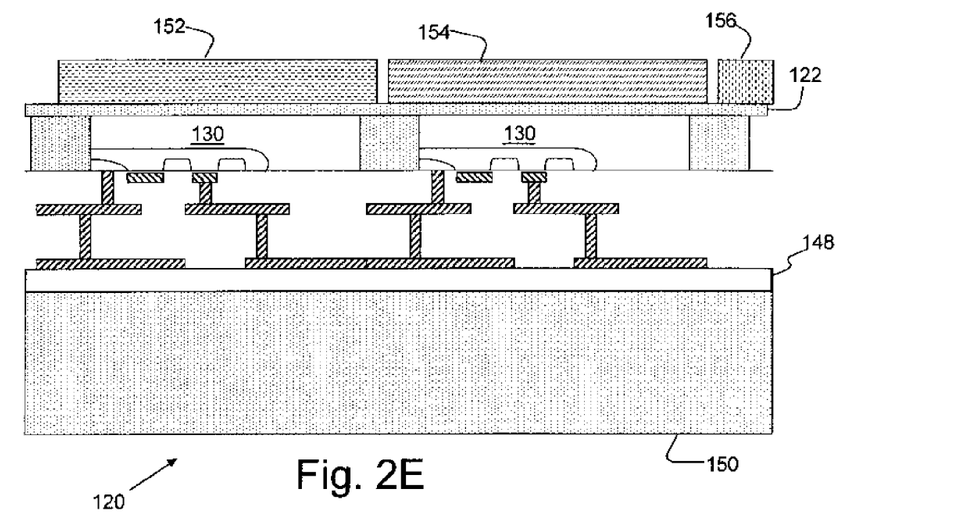

Next in FIG. 2E, the color filter layer is formed in step 110 by forming color filters 152, 154, 156 on the exposed thermal oxide layer 122 at respective pixels 130, e.g., red, green and blue color filters, respectively. Preferably, filters 152, 154, 156 are formed on the entire face of each filtered pixel, masking and depositing an appropriate filter material. Suitable filter material includes, for example, dyed and pigmented photo resists. Typically, the color filters 152, 154, 156 have a uniform thickness of 0.5-1.5 µm.

Figure 2F:
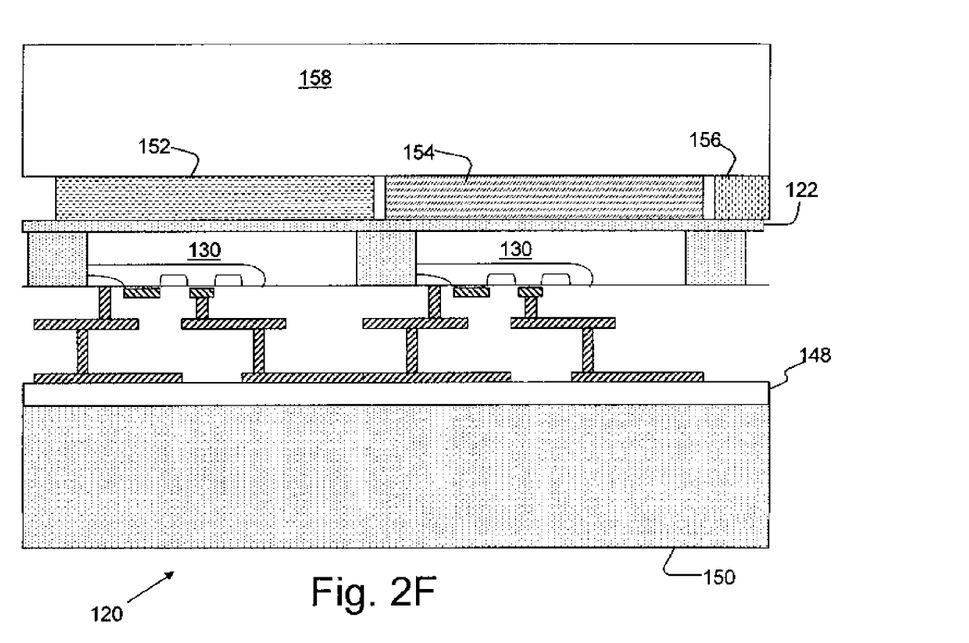

Next, in FIG. 2F, a protective layer 158 or window is formed on the color filter layer in step 112. Preferably, the protective layer 158 is a clear material such as quartz, glass or any other suitable transparent material and forms an imaging window for the sensor. The protective layer 158 may be bonded to the color filter layer using a suitable transparent glue. Optionally, the protective layer 158 is coated with an infrared (IR) filter or an anti-reflective coating.

Figure 2G:
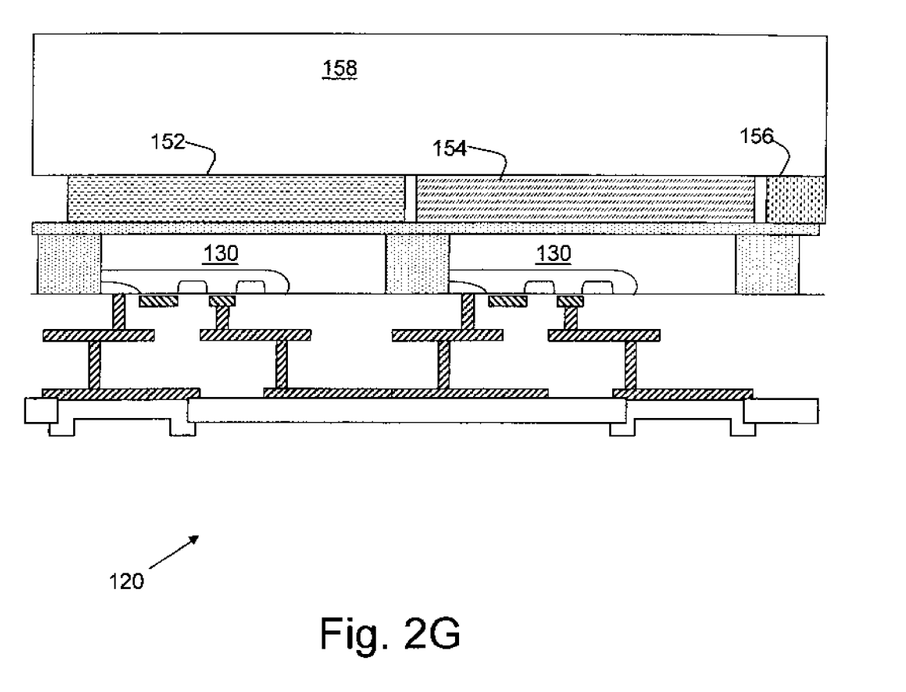

Once the protective layer is bonded to the color filter layer, further processing may be performed to facilitate packaging. If wire bonding or C4s are to be used for chip to package connections, the second or top handle layer 150 may be removed in step 114 for the resulting structure of FIG. 2G. Then, the wafer 120 is diced into individual sensor chips and packaged in step 116. Alternately, the top handle layer 150 may remain in place, if a chip scale package (e.g., from Shell Case Corporation) is to be used. Instead, for such a chip scale package, the connections are formed along exposed sides of the top handle layer 150 or, through vias formed through the second handle layer 150 to allow backside connections. Thus, an image striking the protective layer 158 passes through to a respective color filter 152, 154, 156, and strikes a respective photo-sensor diode at what is normally considered the backside of the chip, i.e., silicon layer, unattenuated by other chip structures.

Figure 3A:
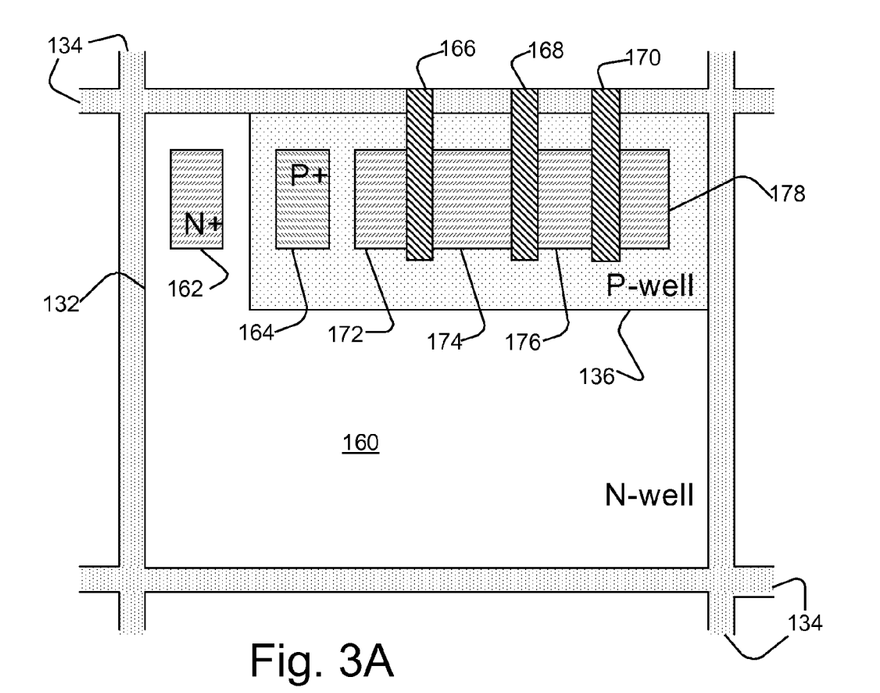
FIGS. 3A-B show a plan view and a schematic example of typical pixel.
Figure 3B:
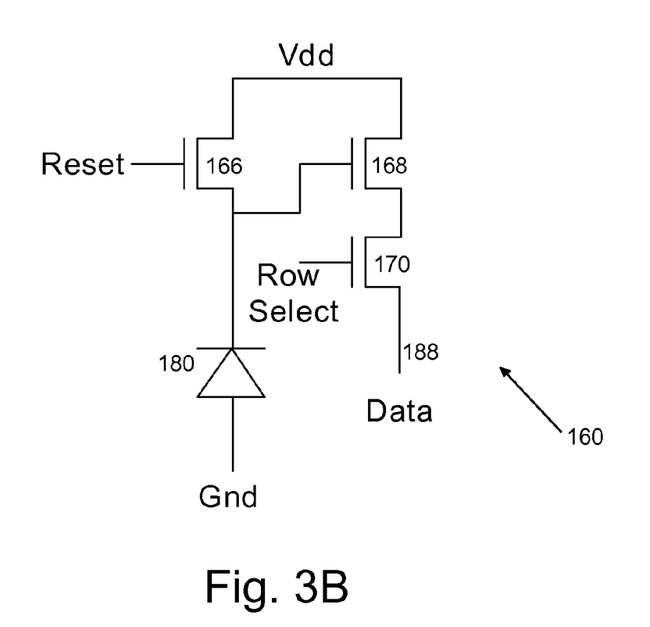

FIGS. 3A-B show an example of a topside plan view and schematic of typical pixel 160, formed according to a preferred embodiment of the present invention. While this pixel 160 is not identical to the pixels 130 in FIGS. 2A-G, it may be formed substantially as described for the array embodiment of FIGS. 2A-G, with like structural elements labeled identically. In this example, the island 132 is N-type, e.g., defined during a typical N-well definition step and islands 132 are isolated from each other by STI trenches 134. The photo-sensor diode is the junction formed by the P-well 136 in the N-well island 132. Resistive contacts 162, 164 are formed to each of the N-well island 132 and P-well 136. FETs (three NFETs in this example) are defined by gates 166, 168, 170 on the P-well 136 and source/drain regions 172, 174, 176,178 (N-type in this example) on opposite sides of the gates 166, 168, 170. The anode of the photo-sensor diode 180 is grounded at the P-well contact 164, which biases the P-well at ground. The cathode of the photo-sensor diode 180 at the N-well contact 164 is connected to the source of 172 of NFET 166 and the gate of NFET 168. NFETs 166 and 168 share a common drain connection 174 to a supply voltage, e.g., $V_{dd}$. A reset signal (RESET) is connected to the gate of NFET 166. The source 176 of NFET 168 is a common diffusion with the drain of NFET 170, which is gated by a row select (ROW SELECT) signal. The source 178 of NFET 170 is also the data output for the pixel 160.

Although RESET at the gate of NFET 166 may be normally high, except during imaging; typically, RESET pulses high just prior to imaging, e.g., just after the shutter button is pushed and just prior to opening the shutter. With RESET high the photo-sensor diode 180 acts substantially like a capacitor, i.e., a reverse biased junction capacitor. Thus, with RESET high a voltage develops across the reverse biased photo-sensor diode 180 that depends upon the high level of RESET and the NFET threshold voltage ($V_T$), i.e., for a $V_{dd}$ up-level, $V_{dd}-V_T$ develops. Optionally, to develop a full $V_{dd}$, the up-level may be selected greater than $V_{dd}+V_T$. When the shutter opens, light striking the pixel from beneath (typically passing through the protective glass window and a red, green or blue filter) creates electron hole pairs. These electrons and holes discharge the junction capacitor of the photo-sensor diode 180 in an amount proportionate to the light incident upon the respective pixel 160. If no light strikes the photo-sensor diode 180, the junction remains charged. Depending on the selected RESET up-level provided to the gate of NFET 166, the source 176 is precharged to some level below $V_{dd}$, e.g., $V_{dd}$-$V_T$. NFET 168 acts as a source follower amplifier to sense the voltage on the junction capacitor. The potential on the source of NFET 168 follows the voltage on the photo-sensor diode 180. This voltage passes through NFET 170. The ROW SELECT at the gate of NFET 170 is normally low until after an image signal is captured by the photo-sensor diode 180, and then pulsed high during the cell read cycle.

Figure 4:
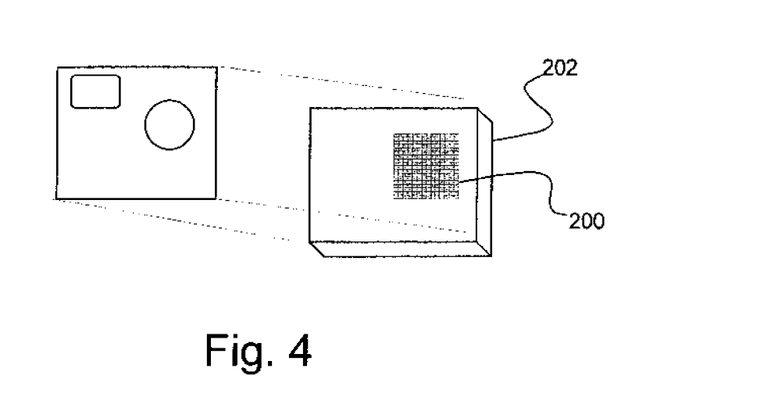
FIG. 4 shows an example of a digital camera with a preferred embodiment imaging sensor array.

FIG. 4 shows an example of application of a preferred embodiment chip 200 in a digital camera 202. Such application of imaging sensors, and digital cameras as well, are well known in the art. The chip package may be a typical wire bond package, because the light passes through the window provided by the protective layer and filtered by the color filters on the surface opposite the chip connections. Thus, with the chip mounted using flip chip technology, the full protective window area is exposed above the mounted chip and the color filters and pixels therebelow are fully protected by the protective window.

Advantageously, the entire silicon island surface is exposed for each pixel. Since each pixel substantially occupies the entire pixel area (less the shared STI), the array fill factor increases from below 30% to nearly 100%. This allows for even further area reduction since pixels may be smaller without losing sensitivity to light, for even further cost savings. A preferred pixel captures a larger dose of the available energy with none being blocked by wiring, which is at the backside of a preferred pixel. Thus, such a preferred pixel exhibits a high quantum efficiency with a high fill factor. STI isolates each pixel from the adjacent pixels not allowing any carriers to flow between photo diodes. This virtually eliminates color cross talk and blooming. Moreover, a preferred imaging sensor has an excellent angle response and micro lenses are unnecessary because there is little distance between the color filters and the light sensitive silicon. The preferred protective layer eliminates the need for a top glass cap in the package or an air gap over a micro-lens, such as prior art sensors require. Both because micro lenses are unnecessary and because the protective layer serves as a suitable imaging window, packaging is further simplified. Since the wiring is on the pixel backside, wire bonds, for example, may be used without concern that they might interfere with pixel illumination.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

We claim:

1. An imaging sensor comprising:
a pixel array, each pixel comprising:
a semiconductor island of a first conduction type,
a dielectric layer;
an isolation well of a second conduction type in one surface of said semiconductor layer, said second conduction type being opposite said first conduction with said isolation well forming a photo-sensor on said one surface with said semiconductor layer, the other surface of said semiconductor island being at and adjacent to said dielectric layer,
cell wiring to said cell extending from photo-sensor structures in said one surface, and
a color filter separated from said semiconductor layer by said dielectric layer;
a trench to said dielectric layer surrounding each said semiconductor island; and
a protective layer on said pixel array at pixel color filters, an optical signal passing through said protective layer, through said dielectric layer and then, through said semiconductor island to said photo-sensor, being filtered by said color filters and causing current flow across said semiconductor island and said isolation well junction selectively sensed by a corresponding said photo-sensor.

2. An imaging sensor as in claim 1, wherein said semiconductor island is 2-6 µm thick silicon island separated from adjacent silicon islands by said trench and said color filter is 0.5-1.5 µm thick and said dielectric layer a 0.1-1.0 µm thick oxide layer.

3. An imaging sensor as in claim 2, wherein said silicon island is doped N-type, said isolation well is a P-well in said N-type silicon island forming a photodiode and NFETs on said P-well are connected to said photodiode to selectively sense said optical signal.

4. An imaging sensor as in claim 3, wherein said active silicon layer and said oxide layer are silicon on insulator (SOI) layers in a CMOS SOI chip and said NFETs comprise:
a first NFET connected between the cathode of said photodiode and a supply voltage ($V_{dd}$), said first NFET being gated by a reset signal;
a second NFET connected at the drain to said supply voltage and gated by said cathode; and
a third NFET connected between the source of said second NFET and a data output, said third NFET being gated by a pixel select signal.

5. An imaging sensor as in claim 2, wherein a handle layer bonded to a surface above said cell wiring, said pixel array being sandwiched between said protective layer and said handle layer.

6. An imaging sensor cell comprising:
a semiconductor layer of a first conduction type;
a dielectric layer;
an isolation trench to said dielectric layer surrounding said semiconductor layer;
an isolation well of a second conduction type in one surface of said semiconductor layer, said second conduction type being opposite said first conduction type with said isolation well forming a photo-sensor on said one surface with said semiconductor layer, the other surface of said semiconductor layer being at and adjacent to said dielectric layer;
a color filter separated from said semiconductor layer by said dielectric layer; and
a protective layer on said color filter, light passing through said protective layer, through said dielectric layer and then, through said semiconductor layer, and filtered by said color filter causing current flow across said semiconductor layer and said isolation well junction being selectively sensed by said photo-sensor.

7. An imaging sensor cell as in claim 6, wherein wiring to said cell extends away from said semiconductor layer from photo-sensor structures in said one surface.

8. An imaging sensor cell as in claim 6, wherein said semiconductor layer is an active silicon layer and said dielectric layer is an oxide layer.

9. An imaging sensor cell as in claim 8, wherein said active silicon layer is 2-6 µm thick and said oxide layer is 0.1-1.0 µm.

10. An imaging sensor cell as in claim 8, wherein said active silicon layer is doped with an N-type dopant and said isolation well is a P-well in said N-type active silicon layer forming a photodiode, said imaging sensor cell further comprising a plurality of NFETs formed in said P-well, said NFETs connected to selectively sense an optical signal to said photodiode.

11. An imaging sensor cell as in claim 10, wherein said plurality of NFETs comprises:
   a first NFET connected between the cathode of said photodiode and a supply voltage ($V_{dd}$), said first NFET being gated by a reset signal;
   a second NFET connected at the drain to said supply voltage and gated by said cathode; and
   a third NFET connected between the source of said second NFET and a data output, said third NFET being gated by a pixel select signal.

12. An imaging sensor cell as in claim 6, wherein said color filter is in a layer of color filters, said protective layer on said layer of color filters, light passing through said protective layer being filtered by color filters in said layer of color filters.

13. An imaging sensor cell as in claim 12, wherein said protective layer is a quartz layer.

14. An imaging sensor cell as in claim 12, wherein said protective layer further filters out invisible light.

15. An imaging sensor cell comprising:
   a silicon layer;
   a photodiode in a first surface of said silicon layer, said photodiode comprising the junction of an isolation well in said silicon layer;
   a dielectric layer on the other surface of said silicon layer;
   a photo-sensor on said isolation well and including said photodiode;
   a color filter separated from said silicon layer by said dielectric layer; and
   a protective layer on said color filter, light passing through said protective layer, said dielectric layer and said silicon layer filtered color filter photodiode junction current being selectively sensed by said photo-sensor.

16. A CMOS chip including an imaging sensor cell as in claim 15, wherein said dielectric layer is an oxide layer and wiring to said cell extends away from said silicon layer from photo-sensor structures in said one surface.

17. A CMOS chip as in claim 16, wherein said active silicon layer is doped with an N-type dopant and said isolation well is a P-well in said N-type active silicon layer forming said photodiode, said imaging sensor cell further comprising a plurality of NFETs formed in said P-well, said NFETs connected to selectively sense an optical signal to said photodiode.

18. A CMOS chip as in claim 17, wherein said plurality of NFETs comprises:
   a first NFET connected between the cathode of said photodiode and a supply voltage ($V_{dd}$), said first NFET being gated by a reset signal;
   a second NFET connected at the drain to said supply voltage and gated by said cathode; and
   a third NFET connected between the source of said second NFET and a data output, said third NFET being gated by a pixel select signal.

19. A CMOS chip as in claim 18, wherein said color filter is in a layer of color filters, said protective layer on said layer of color filters, light passing through said protective layer being filtered by color filters in said layer of color filters.

20. An imaging sensor cell comprising:
   a semiconductor layer of a first conduction type;
   a dielectric layer, wherein said semiconductor layer is an active silicon layer and said dielectric layer is an oxide layer;
   an isolation trench to said dielectric layer surrounding said semiconductor layer;
   an isolation well of a second conduction type in one surface of said semiconductor layer, said second conduction type being opposite said first conduction type with said isolation well forming a photo-sensor on said one surface with said semiconductor layer, the other surface of said semiconductor layer being at and adjacent to said dielectric layer, wherein said active silicon layer is doped with an N-type dopant and said isolation well is a P-well in said N-type active silicon layer forming a photodiode, said imaging sensor cell further comprising a plurality of NFETs formed in said P-well, said NFETs connected to selectively sense an optical signal to said photodiode, wherein said plurality of NFETs comprises:
       a first NFET connected between the cathode of said photodiode and a supply voltage ($V_{dd}$), said first NFET being gated by a reset signal,
       a second NFET connected at the drain to said supply voltage and gated by said cathode, and
       a third NFET connected between the source of said second NFET and a data output, said third NFET being gated by a pixel select signal, wherein said active silicon layer and said oxide layer are silicon on insulator (SOI) layers in a CMOS SOI chip;
   a color filter separated from said semiconductor layer by said dielectric layer; and
   a protective layer on said color filter, light passing through said protective layer, through said dielectric layer and then, through said semiconductor layer, and filtered by said color filter causing current flow across said semiconductor layer and said isolation well junction being selectively sensed by said photo-sensor.

* * * * *